United States Patent [19]

Jackson, Jr.

[11] 4,032,906

[45] June 28, 1977

[54] CONDITION SAMPLING AND INDICATING SYSTEM

[76] Inventor: Lewis B. Jackson, Jr., 135-1 S. Highland Ave., Ossining, N.Y. 10562

[22] Filed: July 21, 1975

[21] Appl. No.: 597,463

[52] U.S. Cl. .................... 340/196; 324/34 R; 340/413

[51] Int. Cl.² ...................................... G08C 19/00

[58] Field of Search .......... 340/195, 196, 197, 413, 340/58; 323/51, 53; 324/34 R, 47, 133, 179; 200/308

[56] References Cited

UNITED STATES PATENTS

| 2,436,639 | 2/1948 | Faus | 340/196 |
|---|---|---|---|
| 2,928,060 | 3/1960 | Krussmann | 340/196 |
| 2,931,023 | 3/1960 | Quade | 340/196 |
| 3,114,139 | 12/1963 | Warshaw | 340/196 |
| 3,487,306 | 12/1969 | Harmer | 324/47 |
| 3,602,884 | 8/1971 | Brumbelow | 340/58 |
| 3,644,927 | 2/1972 | Green | 340/413 |
| 3,938,144 | 2/1976 | Pederson et al. | 340/413 |

Primary Examiner—John W. Caldwell
Assistant Examiner—James J. Groody
Attorney, Agent, or Firm—Dressler, Goldsmith, Clement, Gordon & Shore, Ltd.

[57] ABSTRACT

A sensing and sampling system for certain elements capable of assuming a plurality of discrete states including a sensor for sensing the state of each circuit element, and a sampling circuit element for sampling the sensor and for providing signals having a characteristic indicative of the state of the circuit element.

10 Claims, 8 Drawing Figures

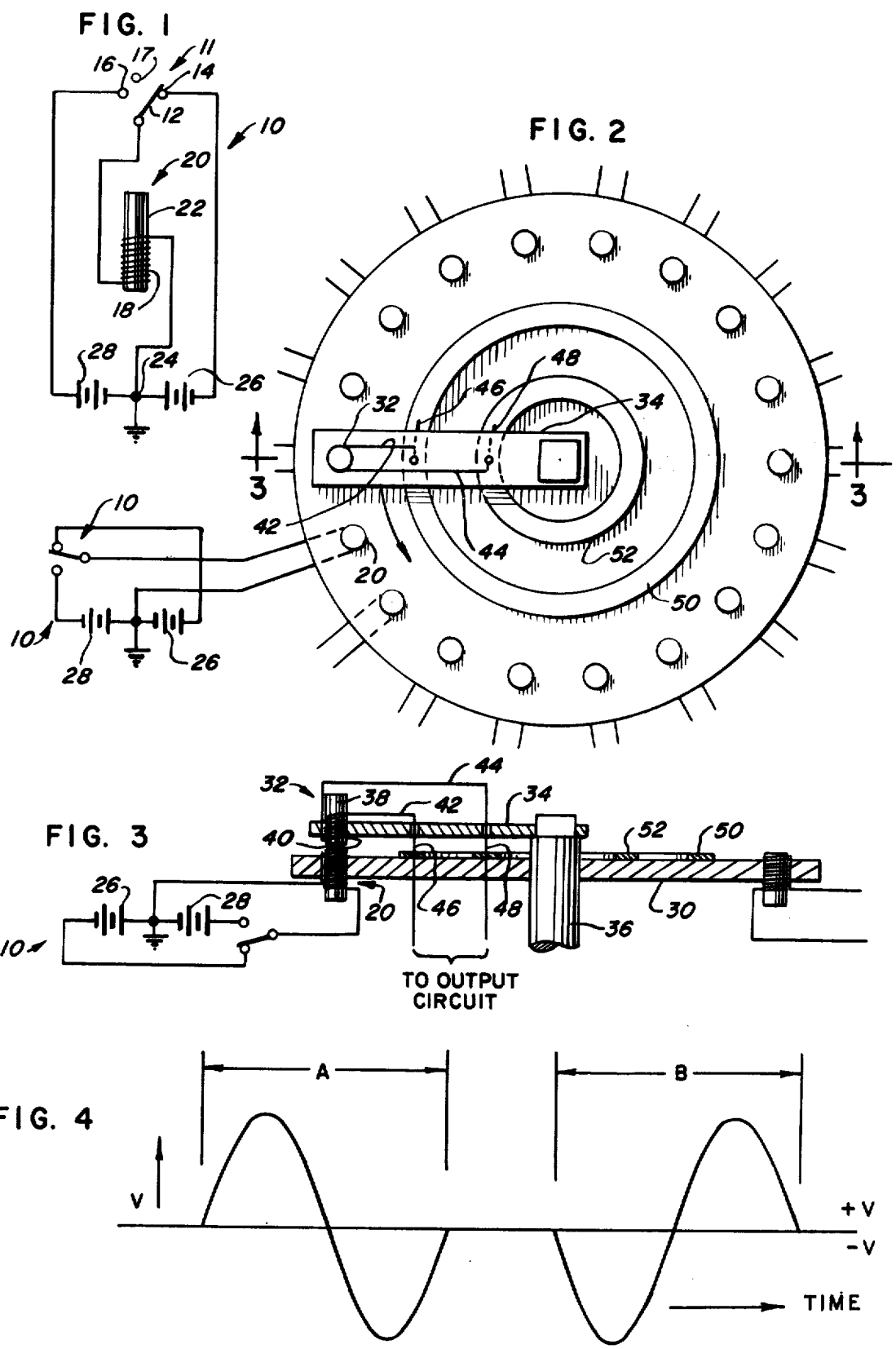

CONDITION SAMPLING AND INDICATING SYSTEM

BACKGROUND OF THE INVENTION

The present invention relates to a system for sampling the state of one or more circuit elements capable of assuming a plurality of discrete states and for providing one or more output signals representative thereof.

There are many instances in which it is desirable to provide outputs indicative of the state of one or more circuit elements capable of assuming a plurality of discrete states.

SUMMARY OF THE INVENTION

In accordance with the present invention there is provided a system for sampling the state of one or more circuit elements capable of assuming a plurality of discrete states and for providing one or more output signals representative thereof. A system in accordance with the present invention may be utilized as a sampling and indicating system, as a pulse generator, as a signal distributor, or as combinations thereof.

In accordance with one apsect of the present invention, there is provided means for sensing the state of one or more circuit elements capable of assuming a plurality of discrete states, means for sampling the sensors, and means for providing output signals having a characteristic representative of the state of the sensed circuit elements. The sensors may be sampled sequentially, e.g., by scanning, and repetitively without destroying the information in the sensor.

In one embodiment, sensing and sampling is effected by inductors movable relative to each other through positions where the inductors are inductively coupled to produce output signals having a polarity characteristic representative of the state of the circuit elements to which the inductive sensors are connected. Suitable output circuitry produces output pulses or signals representative of the states of the sequentially scanned or sampled sensors.

Alternatively, one sensor can be sampled or scanned a plurality of times to provide a plurality of different outputs representative of the state of a single circuit element.

Numerous other advantages and features of the present invention will become readily apparent from the following detailed description of the invention and of one embodiment thereof, from the claims and from the accompanying drawing in which each and every detail shown is fully and completely disclosed as a part of this specification in which like numerals refer to like parts.

Brief Description of the Drawing

FIG. 1 is a diagrammatic circuit diagram of the sensing portion of the present invention;

FIG. 2 is a plan view of one embodiment of the present invention;

FIG. 3 is a sectional view taken along lines 3—3 of FIG. 2;

FIG. 4 is an illustration of two idealized wave forms produced in accordance with the present invention;

DESCRIPTION OF PREFERRED EMBODIMENTS

Figure 5:
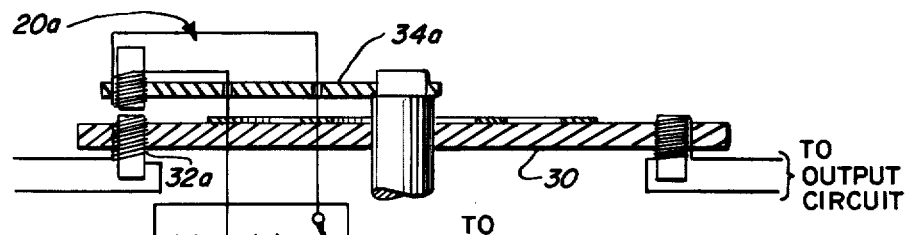
FIG. 5 is a sectional view similar to FIG. 3 showing one alternative embodiment of the present invention.

While this invention is susceptible of embodiment in many different forms, there is shown in the drawings and will herein be described in detail a preferred embodiment of the invention and modifications thereof, with the understanding that the present disclosure is to be considered as an exemplification of the principles of the invention and is not intended to limit the invention to the embodiments illustrated. The scope of the invention will be pointed out in the appended claims.

The sensing and sampling system of the present invention includes as shown in FIG. 1 a sensing circuit 10 including a circuit element 11 to be sampled, shown as a switch having a movable contact 12 and two fixed contacts 14, 16. The switch 11 is illustrative of a circuit element capable of assuming a plurality of stable states. The switch shown, e.g., may be a two or three position switch having two or three stable states.

One position or stable state is shown in FIG. 1 wherein the movable contact 12 is connected through fixed contact 14 to one end of a coil 18 forming a part of an inductive sensing element 20 which may include a magnetic core 22. The other end of the coil 18 is connected to a junction 24 between two sources of electric d.c. potential, shown as a pair of batteries 26, 28. The negative side of one battery 26 is connected to the junction 24 and the positive side of battery 26 is connected to the fixed contact 14. The positive side of the other battery 28 is connected to the junction 24 and the negative side of the second battery 28 is connected to the second fixed contact 16. The second position or stable state of switch 11 occurs when movable contact 12 engages the second fixed contact 16, and a third position or stable state would be one in which the movable contact 12 does not engage either of the fixed contacts.

When the switch 11 is in its first stable state as shown in FIG. 1, current flows through the coil 18 in one direction to produce a first magnetic field. When the switch 11 is in its second stable state, in which the movable contact 12 engages the second fixed contact 16, the current flows through the coil 18 in a second direction producing a second magnetic field. When the switch 11 is in its third stable state, in which the movable contact 12 engages the third fixed contact 17, no current flows through the coil 18, which depending on the type of core used, may result in no magnetic field.

FIGS. 2 and 3 show one embodiment of a system incorporating the present invention in which a plurality of sensors 20 are disposed in a generally planar disc 30. The circuit 10 of FIG. 1 is also shown connected to one of the inductive sensors 20 although it can be appreciated that each of the remaining sensors are also connected to a similar circuit. Alternatively, a plurality of sensors 20 may be connected in parallel as part of a single circuit.

The state of each switch is sampled by a sampling inductor 32 supported in one end of an arm 34 rotatably affixed to pivot 36 extending axially through the disc 30. The sampling inductor 32 is in the form of an electromagnet having a core 38 disposed within a coil 40 connected to a pair of leads 42, 44 which terminate in wiper contacts 46, 48 supported on the undersurface of the rotating arm 34. A pair of conductive rings 50, 52 concentrically disposed about the axis of the disc 30 are continuously engaged by the wiper contacts 46, 48, respectively, as the arm 34 rotates about the axis of the disc 30.

It can be appreciated that as the arm 34 rotates, the sampling inductor 32 passes sequentially over the ends of each of the sensing inductors 20. If a current is flowing in the coil 18, as a result of the switch 11 being in its first of second stable state, a magnetic field is established in the sensing inductor 20. The movement of the sampling inductor 32 past the sensing inductor 20 through a position of inductive coupling therebetween induces a current in the coil 40 of the sampling inductor 32. The polarity characteristic of the induced signal is a function of the magnetic field produced by the sensing inductor 20, which in turn is determined by the current passing through the sensing coil 18.

When, for example, the switch 11 is in its first stable state, the position shown, the signal produced in the sampling inductor 32 as it moves past the illustrated sensing inductor 20 might be as shown in FIG. 4 wave form A. When the position of the switch 11 is reversed, the polarity characteristic of the signal is reversed as shown in FIG. 4, wave form B. If the switch is in its third stable state, no signal is produced.

Thus, as the arm 34 rotates, a succession of pulses or blanks is produced in the sampling inductor 32, each of the pulses having a polarity characteristic which is a function of the state of the switch 11 connected to the respective sensors 20.

If the switch 11 has only two stable states, a bistable saturable core member could be used to avoid the necessity of maintaining the sensing circuit energized continuously. Once a sufficient current passes through the coil 18 to saturate the core 22 in one of its stable states, the source might be disconnected. The bistable core remains in that state until a current of opposite polarity is passed through the coil 18.

FIG. 5 discloses an alternative embodiment in which the sensing inductor 20a is supported in the arm 34 and a plurality of sampling sensors 32a are supported in the disc 30. In this embodiment, the rotating sensor 20a is indicative of the state of one switch 11a connected thereto. The state of switch 11a is repetitively sampled by the plurality sampling inductors 32a as the sensor 20a moves past the sampling inductors 32a.

Figure 6:
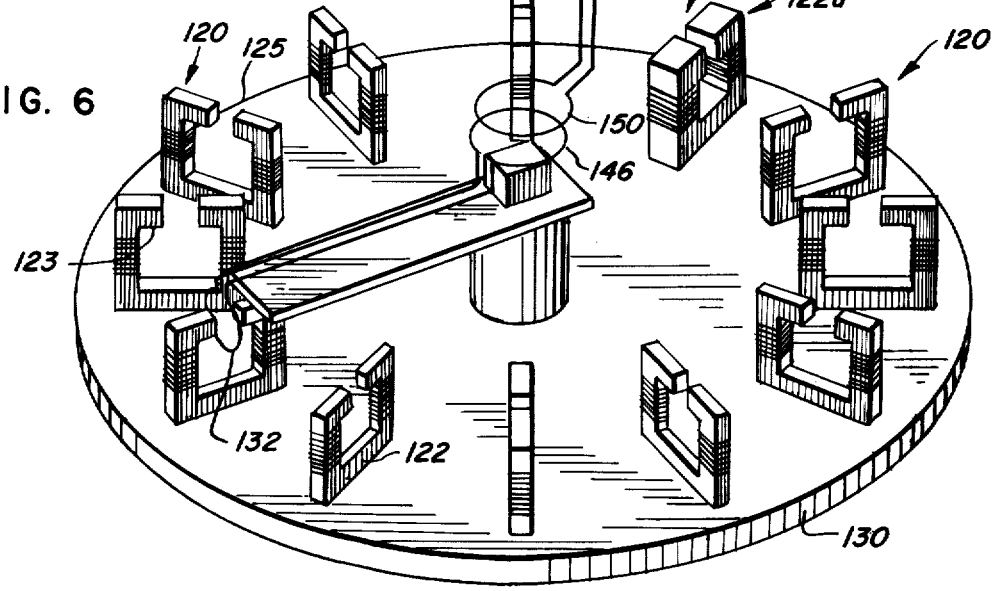
FIG. 6 is a perspective view showing another alternative embodiment of the present invention.

FIG. 6 is a perspective view of another alternative embodiment incorporating a number of variations of the basic system. Thus, in FIG. 6 the sensors 120 include as core members a plurality of generally horseshoe magnets 122 having pole pieces 123 juxtaposed to define a gap 125 therebetween. This configuration of the sensor cores 122 concentrates the magnetic field 55 and allows the use of a sampling inductor in the form of a simple one turn coil 132 to be passed between the poles 123 of the magnetic core 122.

In the embodiment of FIG. 6, the sampling coil 132 forms part of a closed loop circuit having an output transfer coil 146 disposed along the axis of the disc 130. The output transfer coil 146 is inductively coupled to an output coil 150. The use of the inductive coupled output circuit eliminates the conductive contacts and mechanical wear that would otherwise possibly be associated therewith. If desired, coupling of the transfer coil 146 and output coil 150 may be enhanced by the use of a suitable core member 160.

If desired, one of the sensors identified as 120a may utilize an enlarged core member 122a for the purpose of inducing a signal in the sampling coil 132 having an amplitude somewhat greater than the signals induced by the remaining sensors 120. The signal of greater amplitude may be used as a timing or trigger signal for the purpose of synchronizing the induced output signals.

Figure 7:
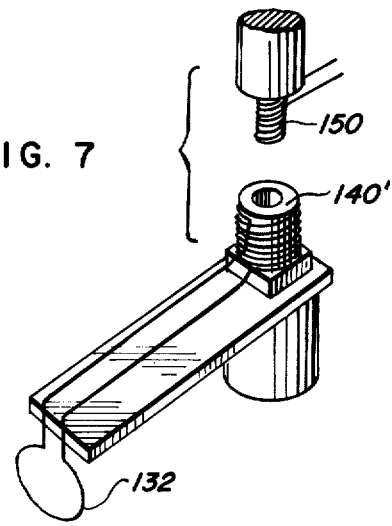
FIG. 7 is a partial perspective view showing yet another alternative embodiment of the present invention.

FIG. 7 shows another variation of the transfer and output coils. As shown, coaxially disposed multi-turn coils 146' and 150' are used to increase the coupling and provide desired output characteristics.

Figure 8:
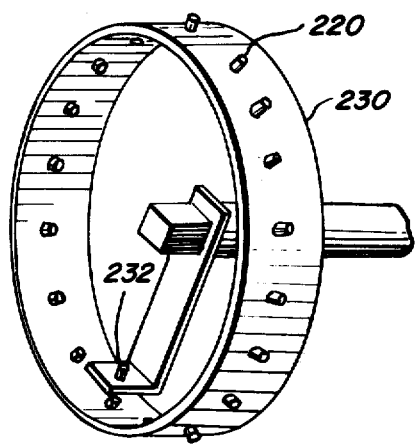
FIG. 8 is a perspective view showing a further alternative embodiment of the present invention.

It should be understood, that the present invention is not limited to one physical configuration such as the disc and rotating arm shown in FIGS. 2–6. Thus, for example, the plurality of sensors 220 may be supported in the surface of a generally cylindrical ring 230 and the single rotating sampling inductor 232 could be disposed internally of the ring as shown in FIG. 8.

Thus, there has been disclosed, a system for sensing the state of a multiple state circuit element such as a bistable element or switch, for sampling the sensed state, and for providing an output signal representative thereof.

From the foregoing, it will be observed that numerous variations and modifications may be effected without departing from the true spirit and scope of the novel concept of the invention. It is, of course, intended to cover by the appended claims all such modifications as fall within the scope of the claims.

I claim:

1. A system for sensing, sampling and indicating the state of each of a plurality of electrical circuit elements comprising:

a plurality of circuit elements each being capable of assuming a plurality of discrete states;

a plurality of first circuit means each electrically connected to a different one of said plurality of circuit elements for sensing the state thereof and for assuming a condition indicative of said sensed state;

each of said first conduit means including inductive sensor means and a source of d.c. potential connected between one of said circuit elements and said inductive sensor means for providing a first current through said inductive sensor means when said circuit element is in one of its discrete states and providing a second current through said inductive sensor means when said circuit element is in a second of its discrete states;

said inductive sensor means assuming a first condition in which a first magnetic field is produced in response to said first current and assuming a second condition in which a second magnetic field is produced in response to said second current;

second circuit means for sampling said first circuit means and for producing a plurality of electrical sampling signals, each having a characteristic representative of said condition and thereby of the sensed state of one of said circuit elements; and means for sequentially coupling said second circuit means to each of said plurality of first circuit means for effecting said samping thereof;

whereby the state of each of said circuit elements is represented by said characteristic of a corresponding one of said sampling signals.

2. A system as claimed in claim 1 wherein:

said second circuit means includes inductive sampling means; and said coupling means effects relative movement between each of said inductive sensor means and said inductive sampling means to effect intermittent inductive coupling therebetween for producing in said sampling means one of said sampling signals for each inductive sensor to which it is coupled, said one sampling signal having a first polarity in response to said first magnetic field and having a second polarity characteristic in response to said second magnetic field.

3. A system as claimed in claim 2 wherein:

said coupling means moves said inductive sampling means to effect sequential inductive coupling between said sampling means and successive ones of said plurality of said inductive sensor means for producing in said sampling means said sampling signals in the form of a pulse train in which the polarity characteristics of each pulse is representative of the state of a corresponding one of said sensed circuit elements.

4. A system as claimed in claim 3 wherein:

said coupling means is operative to repetitively move said inductive sampling means sequentially past said inductive sensors.

5. A system as claimed in claim 3 including:

a support member having an axis;

said inductive sensors being supported by said support member at circumferentially spaced locations about the axis thereof, and said inductive sampling means being rotatable about said axis to effect said successive intermittent coupling with each of said inductive sensors.

6. A system as claimed in claim 3 wherein:

selected ones of said inductive sensor means include an electromagnetic core element for enhancing the magnetic field produced thereby and the coupling with said inductive sampling means.

7. A system as claimed in claim 6 wherein:

selected ones of said core elements are saturable bistable magnetic cores, whereby the magnetic state thereof persists after termination of the current passing therethrough.

8. A system as claimed in claim 3 wherein:

each of said inductive sensor means includes an electromagnet having a core structure defining a gap between two spaced poles thereof, and said inductive sampling means includes a coil adapted to pass between said poles.

9. A system as claimed in claim 2 wherein:

said inductive sampling means is connected to inductive transfer means, and includes an inductive output means coupled to said inductive transfer means for producing output pulses in response to said representative of said sampling signal.

10. A system as claimed in claim 6, in which selected ones of said inductive sensors have core members of varying configurations whereby the amplitude of the sample signal varies as a function of the core configuration.

* * * * *